United States Patent
Hattori et al.

(10) Patent No.: US 10,707,769 B2
(45) Date of Patent: Jul. 7, 2020

(54) POWER CONVERSION CIRCUIT BOARD AND ELECTRIC COMPRESSOR

(71) Applicant: MITSUBISHI HEAVY INDUSTRIES THERMAL SYSTEMS, LTD., Tokyo (JP)

(72) Inventors: Makoto Hattori, Kiyosu (JP); Hiroyuki Kamitani, Kiyosu (JP); Hiroto Higuchi, Kiyosu (JP)

(73) Assignee: MITSUBISHI HEAVY INDUSTRIES THERMAL SYSTEMS, LTD., Tokyo (JP)

( * ) Notice: Subject to any disclaimer, the term of this patent is extended or adjusted under 35 U.S.C. 154(b) by 0 days.

(21) Appl. No.: 15/560,066

(22) PCT Filed: Feb. 15, 2016

(86) PCT No.: PCT/JP2016/054262
§ 371 (c)(1),
(2) Date: Sep. 20, 2017

(87) PCT Pub. No.: WO2016/152313
PCT Pub. Date: Sep. 29, 2016

(65) Prior Publication Data
US 2018/0076733 A1    Mar. 15, 2018

(30) Foreign Application Priority Data
Mar. 24, 2015 (JP) .................................. 2015-060840

(51) Int. Cl.
*H02M 7/42* (2006.01)
*H02M 7/00* (2006.01)
(Continued)

(52) U.S. Cl.
CPC .............. *H02M 7/003* (2013.01); *H01G 2/06* (2013.01); *H05K 1/0231* (2013.01); *F04B 17/03* (2013.01);
(Continued)

(58) Field of Classification Search
CPC ...... H05K 1/0231; H05K 1/162; H05K 1/181; H01L 2924/19041; H01G 2/06;
(Continued)

(56) References Cited

U.S. PATENT DOCUMENTS 5,896,286 A * 4/1999 Terasawa .............. H02M 7/003
363/132
7,505,294 B2 * 3/2009 Ahmed .................. H02M 7/003
363/132
(Continued)

FOREIGN PATENT DOCUMENTS

CN  101182855 A  4/2008
CN  104271405 A  1/2015
(Continued)

OTHER PUBLICATIONS

International Search Report dated Apr. 26, 2016 in Application No. PCT/JP2016/054262 with an English Translation.
(Continued)

*Primary Examiner* — Gary L Laxton
(74) *Attorney, Agent, or Firm* — Birch, Stewart, Kolasch & Birch, LLP

(57) ABSTRACT

A power conversion circuit board is a board on which a power conversion circuit which converts direct current to alternating current is mounted. A low voltage circuit to which a low voltage is applied and a high voltage circuit to which a high voltage is applied are separately disposed in different areas on the same board surface. Further, in the high voltage circuit, a part of a wiring is formed on the board
(Continued)

surface, and another wiring includes a bus bar which is provided with a predetermined distance from the board surface.

6 Claims, 6 Drawing Sheets

(51) Int. Cl.
*H01G 2/06* (2006.01)
*H05K 1/02* (2006.01)
*H02M 7/53* (2006.01)
*F04B 39/00* (2006.01)
*F04B 35/04* (2006.01)
*F04B 17/03* (2006.01)
*F04B 49/06* (2006.01)

(52) U.S. Cl.
CPC ............... *F04B 35/04* (2013.01); *F04B 39/00* (2013.01); *F04B 49/06* (2013.01); *H02M 7/53* (2013.01)

(58) Field of Classification Search
CPC .......... F04B 17/03; F04B 35/04; F04B 39/00; F04B 49/06; H02M 7/53
See application file for complete search history.

(56) References Cited

U.S. PATENT DOCUMENTS

| | | | | |
|---|---|---|---|---|
| 2006/0146480 | A1* | 7/2006 | Thrap | H01G 2/04 361/522 |
| 2007/0195485 | A1* | 8/2007 | Erhardt | H01G 9/06 361/328 |
| 2008/0087458 | A1 | 4/2008 | Hattori et al. | |
| 2008/0130253 | A1* | 6/2008 | Yamashita | H05K 1/181 361/760 |
| 2009/0246047 | A1* | 10/2009 | Hattori | H02K 11/01 417/410.1 |
| 2015/0043132 | A1 | 2/2015 | Miyashita et al. | |

FOREIGN PATENT DOCUMENTS

| | | |
|---|---|---|
| JP | 2003-324030 A | 11/2003 |
| JP | 2008-99480 A | 4/2008 |
| JP | 2011-229397 A | 11/2011 |
| JP | 2011-249412 A | 12/2011 |
| WO | WO 2014/027536 A1 | 2/2014 |

OTHER PUBLICATIONS

Written Opinion dated Apr. 26, 2016 in Application No. PCT/JP2016/054262 with an English Translation.

* cited by examiner

POWER CONVERSION CIRCUIT BOARD AND ELECTRIC COMPRESSOR

TECHNICAL FIELD

The present invention relates to a power conversion circuit board and an electric compressor.

Priority is claimed on Japanese Patent Application No. 2015-060840, filed Mar. 24, 2015, the content of which is incorporated herein by reference.

BACKGROUND ART

For example, an in-vehicle air conditioner is required to have a high space-saving property because of the necessity to house various configuration devices in a limited space inside the vehicle. For this reason, in recent years, for the purpose of enhancing the space-saving property, an integrated electric compressor in which a compressor constituting an in-vehicle air conditioner, a motor for driving the compressor, and a circuit board for controlling the compressor are integrally configured has been suggested (e.g., see Patent Literatures 1 and 2).

CITATION LIST

Patent Literature

[Patent Literature 1]
Japanese Unexamined Patent Application, First Publication No. 2008-099480
[Patent Literature 2]
Japanese Unexamined Patent Application, First Publication No. 2011-229397

SUMMARY OF INVENTION

Technical Problem

Conventionally, in an in-vehicle electric compressor, a voltage of several hundred volts has been used as a power source, and voltage exceeding 1000 V at the maximum has not been required in view of a design. However, in recent years, due to environmental changes based on new technical developments, there is a possibility of an input of 1000 V or more being required as a voltage power supply. Meanwhile, it is desired to further reduce the influence of electromagnetic noise that can be generated from the electric compressor on an external device.

The present invention has been made in view of the above-described problems, and an object thereof is to provide a power conversion circuit board and an electric compressor that can reduce the influence of electromagnetic noise on an external device and can further achieve high breakdown resistance.

Solution to Problem

An aspect of the present invention is a power conversion circuit board on which a power conversion circuit configured to convert direct current to alternating current is mounted, wherein a low voltage circuit to which a low voltage is applied and a high voltage circuit to which a high voltage is applied are separately disposed in different areas on the same board surface, and the high voltage circuit has a series capacitor group including a plurality of capacitor elements connected in series between a power supply wiring and a ground wiring.

In this way, since the voltage applied to one capacitor element is divided and reduced, it is possible to enhance the voltage resistance performance as the high voltage circuit. Further, it is possible to select each capacitor element constituting the series capacitor group as desired, the impedance characteristic of the series capacitor group as a whole can be properly controlled in accordance with the electromagnetic noise specific to the product. Thus, it is possible to reduce the influence of electromagnetic noise on external device, and to further attain a high breakdown voltage.

In addition, according to an aspect of the present invention, each of the capacitor elements forming the series capacitor group has different impedance characteristics which enable reduction of electromagnetic noise at a plurality of frequencies in correspondence with the plurality of frequencies at which the electromagnetic noise is equal to or higher than a specified value.

Further, according to an aspect of the present invention, the series capacitor group is mounted at the same position on a front surface side and a back surface side of the board, and two sets of the series capacitor groups mounted at the same position on the front surface side and the back surface side are mounted so that arrangement patterns of the plurality of capacitor elements are identical to each other In this way, it is possible to equalize the capacitance values of the series capacitor group on the front surface side and the back surface side, including the floating capacitance according to the arrangement pattern.

An aspect of the present invention is an electric compressor which includes the above-mentioned power conversion circuit board, and a motor which operates on the basis of AC power supplied from the power conversion circuit board.

Advantageous Effects of Invention

According to the aforementioned power conversion circuit board and electric compressor, it is possible to reduce the influence of electromagnetic noise on the external device, and to further achieve high breakdown resistance.

DESCRIPTION OF EMBODIMENTS

First Embodiment

Hereinafter, the power conversion circuit board according to the first embodiment will be described with reference to FIGS. 1 to 7.

(Overall Structure)

Figure 1:
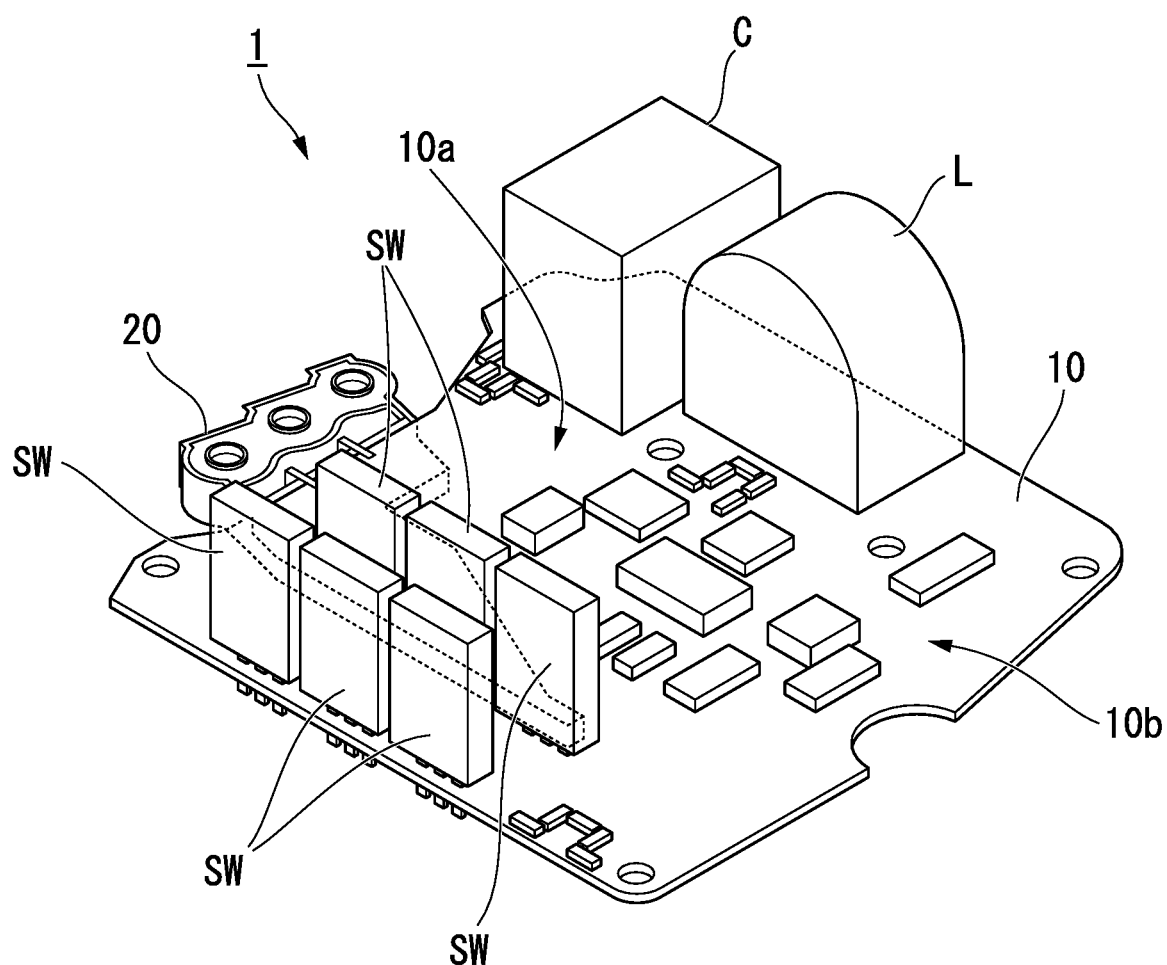
FIG. 1 is a perspective view of a power conversion circuit board according to a first embodiment.

FIG. 1 is a perspective view of a power conversion circuit board according to the first embodiment.

Figure 2:
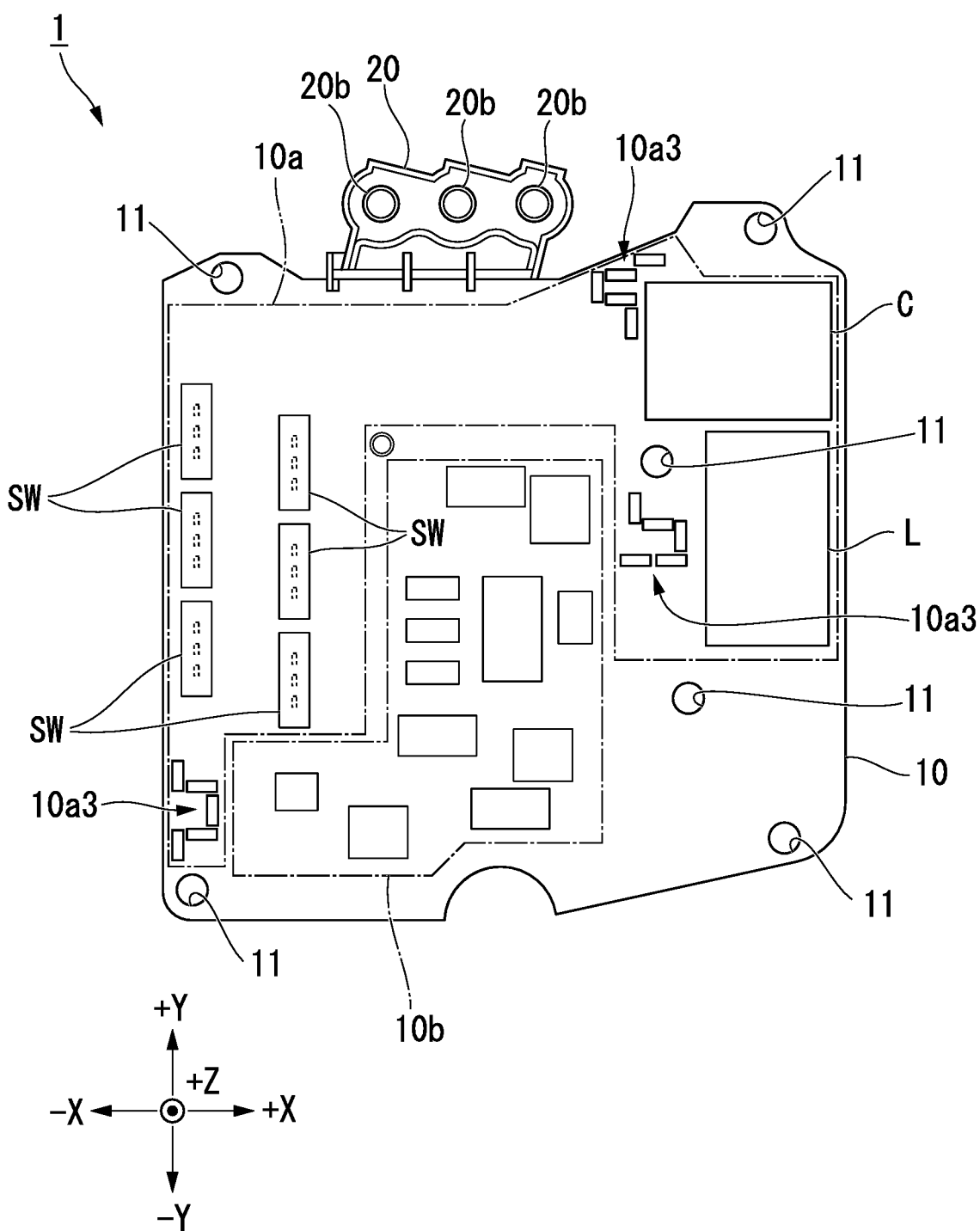
FIG. 2 is a plan view of a power conversion circuit board according to the first embodiment.

Further, FIG. 2 is a plan view of the power conversion circuit board according to the first embodiment.

Figure 3:
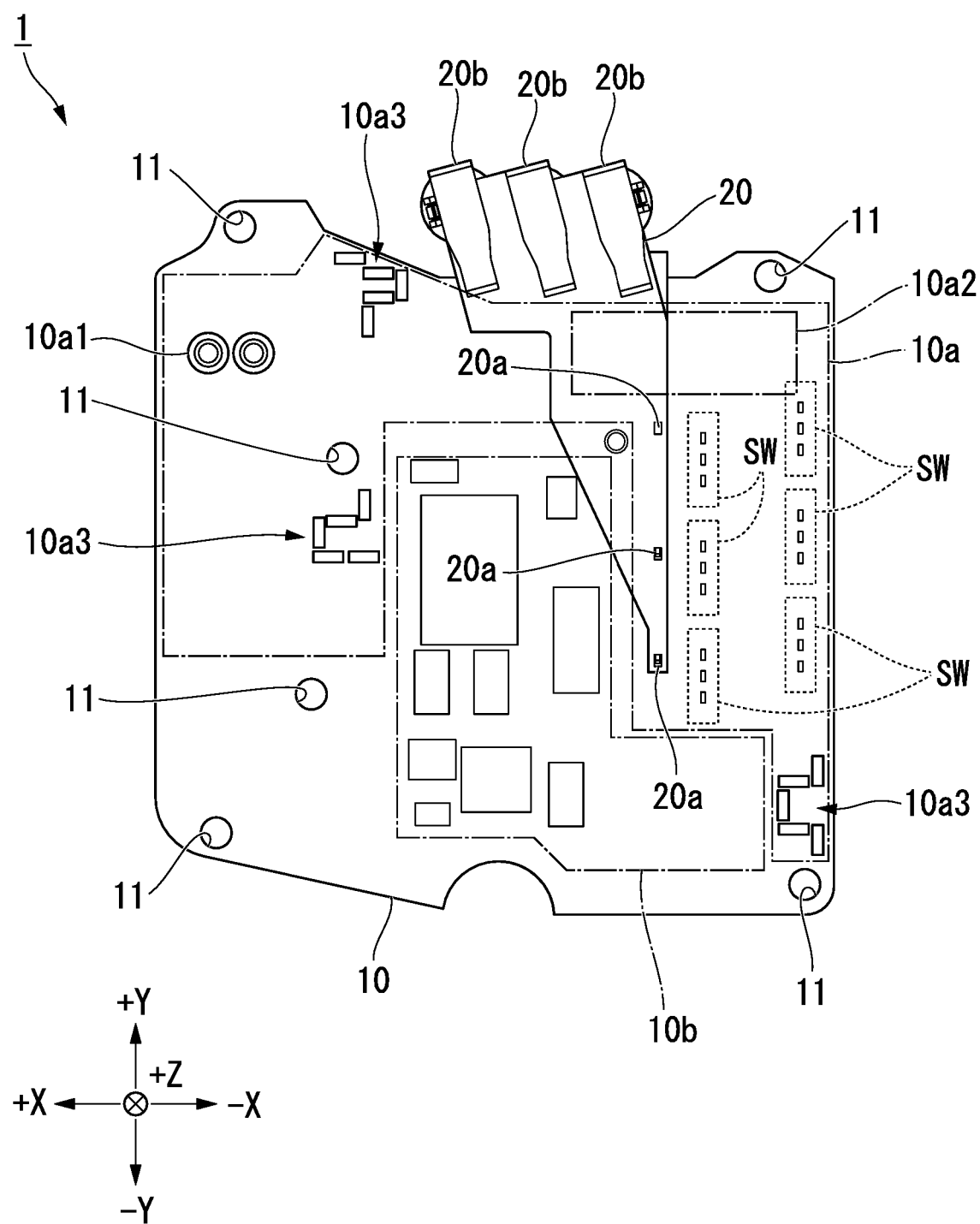
FIG. 3 is a bottom view of the power conversion circuit board according to the first embodiment.

Further, FIG. 3 is a bottom view of the power conversion circuit board according to the first embodiment.

Figure 4:
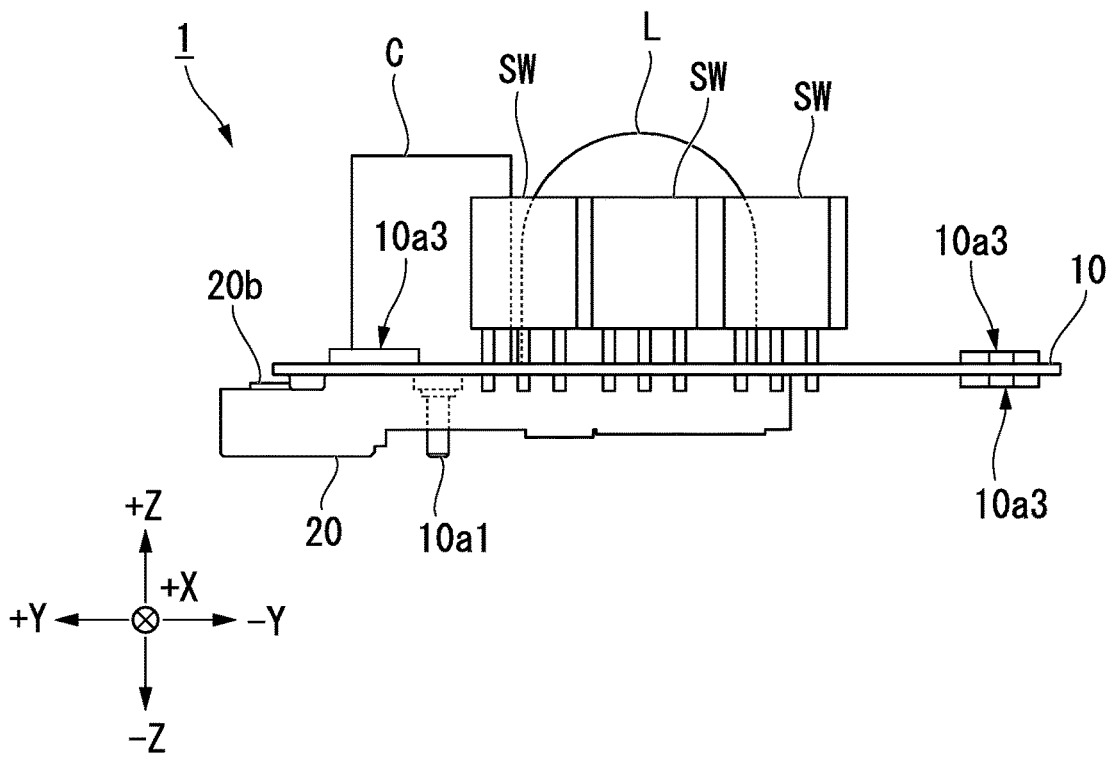
FIG. 4 is a side view of the power conversion circuit board according to the first embodiment.

Further, FIG. 4 is a side view of the power conversion circuit board according to the first embodiment.

Figure 5:
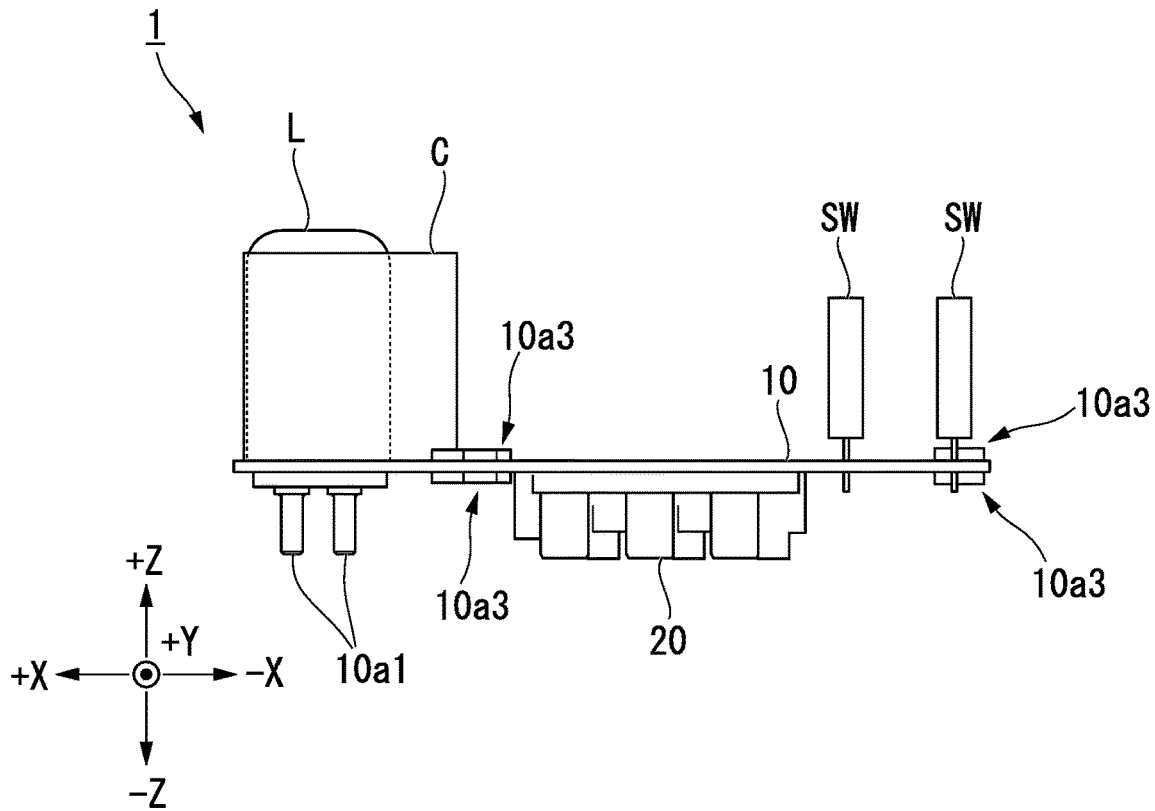
FIG. 5 is a front view of the power conversion circuit board according to the first embodiment.

Further, FIG. 5 is a front view of the power conversion circuit board according to the first embodiment.

The power conversion circuit board 1 according to the first embodiment is a circuit board which constitutes an inverter that converts DC power supplied from the outside through an input terminal (described later) into three-phase AC power. Here, the power conversion circuit board 1 according to the first embodiment is mounted integrally on the electric compressor, together with an AC motor that operates based on the three-phase AC power which is output from the power conversion circuit board 1.

The electric compressor is used, for example, in an air conditioner (car air conditioner) mounted in a vehicle. In this case, the electric compressor (the power conversion circuit board 1) receives the input of the DC power from a battery or the like mounted in the vehicle.

As illustrated in FIGS. 1 to 5, the power conversion circuit board 1 includes a board main body portion 10 and a bus bar support member 20.

The board main body portion 10 is a circuit board on which various circuit elements for configuring a power conversion circuit (inverter) which converts direct current to alternating current are mounted. As illustrated in FIG. 1 and the like, a part of a high voltage circuit 10a to which a high voltage is applied and a low voltage circuit 10b to which a low voltage is applied are separately disposed on the board surface of board main body portion 10 (including both a surface on a +Z direction side and a surface on a −Z direction side) in different areas.

The high voltage circuit 10a is a circuit of a high-power system to which a high voltage required for driving an AC motor (not illustrated) is applied. Specifically, a DC high voltage which is input from a battery or the like mounted on a vehicle is applied to the high voltage circuit 10a. The input DC high voltage is converted into three-phase AC power for driving the AC motor through a switching element SW.

Each switching element SW is switched to an ON state in which a current flows and an OFF state in which a current is interrupted on the basis of a driving signal (gate input) from the low voltage circuit 10b (which will be described later). Each of two switching elements SW is provided to correspond to each of a U-phase, a V-phase, and a W-phase which form a three-phase alternating current. Therefore, a total of six switching elements SW are mounted on the board surface of the board main body portion 10. Three phases (U-phase, V-phase, and W-phase) of AC power are supplied to the AC motor by repeatedly turning ON/OFF at a prescribed timing using each switching element SW.

As the switching element SW, for example, an insulated gate bipolar transistor (IGBT) is representative, but aside from this, a bipolar transistor, a metal-oxide-semiconductor field effect transistor (MOSFET) or the like may be used.

Meanwhile, the low-voltage circuit 10b is a circuit of small signal system which operates at a lower voltage than the high voltage circuit 10a. Specifically, a control chip such as a microcomputer or various kinds of sensors such as a current sensor are mounted on the low voltage circuit 10b, and the low voltage circuit 10b operates by applying a DC low voltage. A microcomputer mounted on the low voltage circuit 10b performs control so that desired three-phase AC power according to the situation is generated, for example, by outputting a predetermined drive signal depending on the detection result of various sensors to each switching element SW.

Further, the board main body portion 10 according to the first embodiment is a multilayer wiring board formed by laminating a plurality of layers. In an area of the board main body portion 10 on which the high voltage circuit 10a is mounted, at least a power supply pattern layer patterned with the power supply wiring to which the high voltage is applied, and a ground (GND) pattern layer on which a ground pattern to be grounded is patterned are stacked.

(Structure of High Voltage Circuit)

Next, the structure of the high voltage circuit 10a will be described in more detail with reference to FIGS. 1 to 5.

As illustrated in FIGS. 1 to 5, in the high voltage circuit 10a, a high voltage input terminal 10a1, an RC circuit 10a2, a switching element SW, a bus bar support member 20, a capacitor C, and an inductor L are electrically connected to each other.

In the following description, the power conversion circuit board 1 will be mainly described with reference to FIG. 3 as seen from the bottom side (the −Z direction side). Here, a +X direction side in FIG. 3 is referred to as a left side (a left end side), a −X direction side is referred to as a right side (a right end side), a +Y direction side is referred to as an upper side (an upper end side), and a −Y direction side is referred to as a lower side (a lower end side) and the like.

The high voltage input terminal 10a1 is mounted on the board surface on the back side (−Z direction side) of the board main body portion 10 and on the left end side (+X direction side) of the board main body portion 10 (see FIG. 3). A separately mounted battery is electrically connected to the high voltage input terminal 10a1, and a DC high voltage is applied from the battery. A capacitor C and an inductor L for high voltage are mounted on the board surface on the opposite side (+Z direction side) of the surface on which the high voltage input terminal 10a1 is mounted (see FIG. 2). The DC high voltage from the battery can be stabilized by the capacitor C and the inductor L for high voltage.

The DC high voltage which is input from the high voltage input terminal 10a1 is input to the six switching elements SW mounted on the right end side, via the RC circuit 10a2 similarly disposed on the right end side (the −X direction side) of the high voltage circuit 10a.

The RC circuit 10a2 is a circuit in which a resistance element and a capacitor element are electrically connected, and functions as a low-pass filter that removes high frequency components. At least a part of the RC circuit 10a2 is mounted on the board surface of the board main body portion 10 in a space between the bus bar support member 20 and the board main body portion 10 to be described later (see FIG. 3 and the like).

The six switching elements SW are mounted on the lower side (the −Y direction side) of the RC circuit 10a2 in the board main body portion 10.

The bus bar support member 20 is disposed on the board surface of the back surface side (the −Z direction side) of the board main body portion 10 to be adjacent to the left side (+X direction side) of the area in which the six switching elements SW are mounted.

The bus bar support member 20 is disposed at a position spaced apart from the board surface on the back surface side of the board main body portion 10 by a predetermined distance (see FIG. 4). Three bus bars corresponding to each of the U-phase, V-phase, and W-phase are mounted inside the bus bar support member 20.

The three bus bars mounted inside the bus bar support member 20 extend from the bus bar connection terminals 20a located on the lower end side (the −Y direction side) of the bus bar support member 20 to the high voltage output terminal 20b located on the upper end side (+Y direction side) of the bus bar support member 20, while maintaining a certain distance from the board surface of the board main body portion 10. In the above constitution, the three bus bars are disposed to cross over above the high voltage circuit 10a mounted from the left end side to the right end side of the board surface of the board main body portion 10.

The three bus bars mounted inside the bus bar support member 20 are electrically connected to the wiring mounted on the board surface of the board main body portion 10 at the bus bar connection terminal 20a. The AC power of each phase generated by the ON/OFF drive of the switching element SW is input to the corresponding bus bar via the bus bar connection terminal 20a. The AC power corresponding to each of the U-phase, the V-phase, and the W-phase is output from the high voltage output terminal 20b of each phase via a bus bar extending from the bus bar connection terminal 20a located on the lower end side of the bus bar support member 20 to the upper end side.

In this way, when the power conversion circuit board 1 is viewed from the bottom side, the high voltage circuit 10a mounted on the power conversion circuit board 1 is disposed such that a wiring from the high voltage input terminal 10a1 of the high voltage circuit 10a to the switching element SW and a wiring from the switching element SW to the high voltage output terminal 20b intersect with each other.

The board main body portion 10 according to the first embodiment has a plurality of series capacitor groups 10a3, which are capacitor elements provided for the purpose of reducing the electromagnetic noise, connected between a power supply wiring to which a high voltage is applied in the high voltage circuit 10a and a ground wiring to be grounded. The series capacitor group 10a3 is formed by connecting a plurality of (for example, five) capacitor elements (for example, on the order of several thousands of pF per element) in series (see FIGS. 2 and 3). Each capacitor element may be, for example, a general ceramic capacitor or the like.

As illustrated in FIGS. 2, 3, and the like, in the present embodiment, the series capacitor groups 10a3 are mounted at the same position (the positions overlapping each other when viewed from the +Z direction side or the −Z direction side) on the front surface side (the surface on the +Z direction side) of the board main body portion 10 and the back surface side (the surface on the −Z direction side) of the board main body portion 10. Further, the two sets of series capacitor groups 10a3 mounted at the same position on the front surface side and the back surface side are mounted so that the arrangement patterns of the plurality of capacitor elements are the same.

In the board main body portion 10 according to the first embodiment, a fixing hole 11 for attachment to a housing of an electric compressor (not illustrated) is provided. The power conversion circuit board 1 is screwed to the housing of the electric compressor through the fixing hole 11.

A plurality of fixing holes 11 are also provided near the center of the board main body portion 10 (see FIGS. 2 and 3), in addition to each of the four corners of the board main body portion 10. At the edge of the fixing hole 11, a grounding land connected to the ground wiring is provided. As a result, when the fixing hole 11 is screwed, the power conversion circuit board 1 is grounded through the grounding land provided at the edge of the fixing hole 11.

Further, the series capacitor group 10a3 is mounted in the vicinity of the fixing holes 11 to correspond to each of the fixing holes 11 (see FIGS. 2 and 3).

(Characteristics of Series Capacitor Group)

Figure 6A:
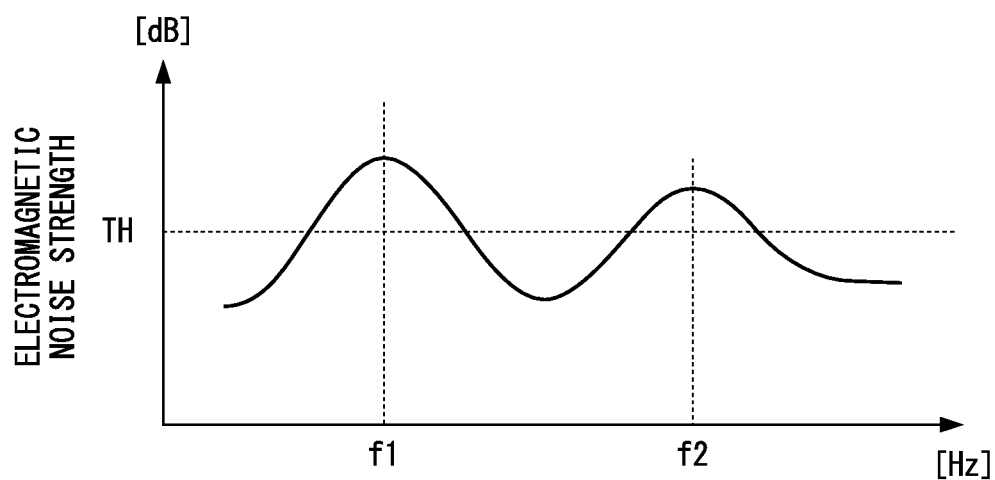
FIG. 6A is a first diagram illustrating the characteristics of a series capacitor group according to the first embodiment.

FIG. 6A is a first diagram illustrating the characteristics of the series capacitor group according to the first embodiment.

Figure 6B:
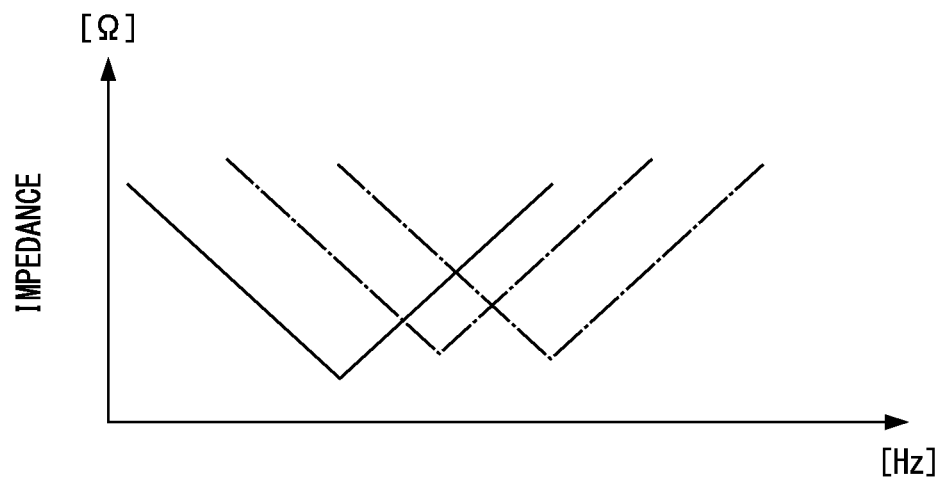
FIG. 6B is a second diagram illustrating the characteristics of the series capacitor group according to the first embodiment.

FIG. 6B is a second diagram illustrating the characteristics of the series capacitor group according to the first embodiment.

The graph illustrated in FIG. 6A illustrates an example of the frequency characteristics of electromagnetic noise generated from the power conversion circuit board 1 (a vertical axis represents the noise intensity [dB] and a horizontal axis represents the frequency [Hz]). Further, the graph illustrated in FIG. 6B illustrates an example of the frequency characteristics of the impedance of each capacitor element constituting the series capacitor group 10a3 (a vertical axis represents the impedance [Ω] and the horizontal axis represents the frequency [Hz]).

Here, the electromagnetic noise radiated from the power conversion circuit board 1 has a frequency characteristic unique to the product due to the characteristics of the element to be mounted, its circuit pattern, applied voltage, operating frequency, and the like. For example, as illustrated in FIG. 6A, the electromagnetic noise of the power conversion circuit board 1 exhibits intensity higher than a predetermined value TH at a plurality of different frequencies f1 and f2.

In this case, the five capacitor elements constituting the series capacitor group 10a3 are selected to be able to reduce the electromagnetic noise at the plurality of frequencies f1 and f2, to correspond to the plurality of frequencies f1 and f2 at which the electromagnetic noise is equal to or greater than the specified value TH.

Specifically, the impedance (Ω) of the capacitor element has a frequency characteristic as illustrated in FIG. 6B. That is, due to the resonance characteristic, there is a frequency band in which the impedance locally decreases.

The frequency characteristics of the impedance of the capacitor element differ depending on the type or the like of the capacitor element to be selected. Therefore, in the impedances of each capacitor element constituting the series capacitor group, by combining the frequency characteristics of different impedances to correspond to the frequencies f1 and f2 with strong electromagnetic noise, the electromagnetic noise of the desired frequency (frequencies f1, f2, etc.) can be effectively reduced.

(Operational Effect)

Figure 7:
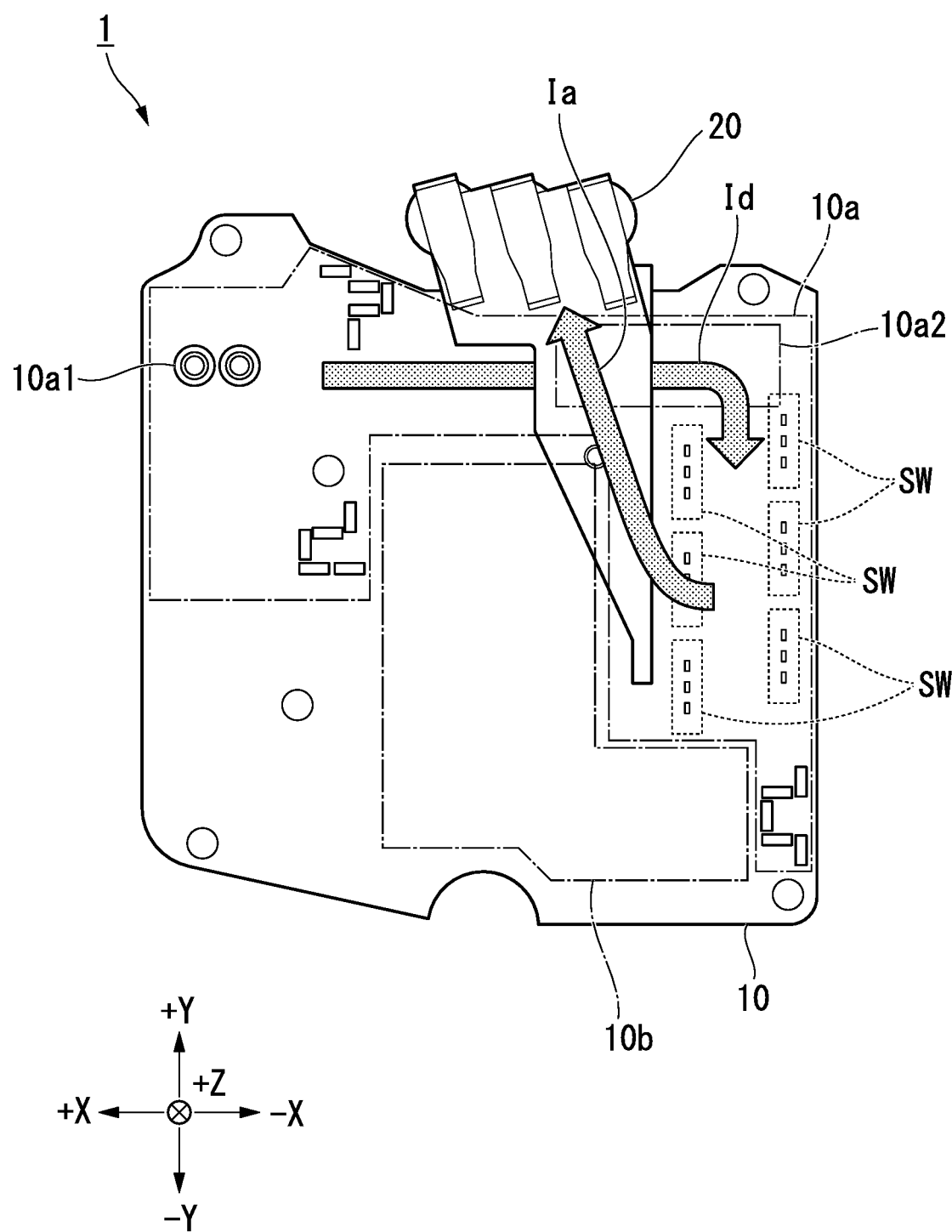
FIG. 7 is a diagram illustrating operational effects based on the structure of the high voltage circuit according to the first embodiment.

FIG. 7 is a diagram illustrating the operational effect based on the structure of the high voltage circuit according to the first embodiment.

According to the power conversion circuit board 1 of the first embodiment, as illustrated in FIG. 7, the low voltage circuit 10b to which a low voltage is applied and the high voltage circuit 10a to which a high voltage is applied are separately disposed one by one in different areas of the same board surface.

In this way, since the high voltage circuit 10a and the low voltage circuit 10b are separately disposed, it is possible to reduce the degree of interference of the electromagnetic noise radiated from the high voltage circuit 10a to the low voltage circuit 10b. Further, since the high voltage circuit 10a and the low voltage circuit 10b are disposed on the same board surface, space saving can be achieved.

As described above, according to the power conversion circuit board 1, it is possible to reduce the influence of electromagnetic noise, while maintaining the space-saving property.

Further, in the power conversion circuit board 1 according to the first embodiment, as illustrated in FIG. 7, in the high voltage circuit 10a, wiring (wiring through which the direct current Id flows) from the high voltage input terminal 10a1 to the switching element SW is formed on the board surface of the board main body portion 10, and the wiring (wiring through which the alternating current Ia flows) from the switching element SW to the high voltage output terminal 20b comprises a bus bar which is provided at a predetermined distance from the board surface.

In this way, electromagnetic noise (ringing noise or the like) generated by driving of the switching element SW is absorbed between the wiring formed on the board surface of the board main body portion 10 and the bus bar provided at a predetermined distance from the board surface, in addition to the RC circuit 10a2. Thus, electromagnetic noise can be prevented from being radiated to the outside.

Further, according to the power conversion circuit board 1 of the first embodiment, the wiring from the high voltage input terminal 10a1 to the switching element SW and the wiring from the switching element SW to the high voltage output terminal 20b are disposed to intersect with each other. In other words, the wiring (the wiring mounted on the board surface of the board main body portion 10a) of the high voltage circuit 10a through which the direct current Id flows and the wiring of the high voltage circuit 10a through which the alternating current Id flows (the bus bar supported by the bus bar support member 20) are configured to three-dimensionally intersect with each other.

In this way, since the electromagnetic noise generated by driving of the switching element SW is effectively absorbed by the portions in which the electromagnetic noises intersect with each other, it is possible to further effectively suppress the electromagnetic noise from being radiated to the outside.

Further, by adopting the three-dimensionally intersecting structure, the region of the power conversion circuit board 1 occupied by the high voltage circuit 10a can be compactly integrated into one. Therefore, the entire power conversion circuit board 1 can be further downsized (space-saving).

Further, according to the power conversion circuit board 1 of the first embodiment, at least a part of the RC circuit 10a2 is provided in the space provided between the wiring from the high voltage input terminal 10a1 to the switching element SW and the wiring from the switching element SW to the high voltage output terminal.

In this way, it is possible to obtain an effect of removing electromagnetic noise on the basis of the function of the RC circuit 10a2 as a low-pass filter. In order to secure the space required for mounting the RC circuit 10a2, it is possible to effectively utilize the space provided between the wiring from the high voltage input terminal 10a1 to the switching element SW and the wiring from the switching element SW to the high voltage output terminal. Therefore, it is possible to achieve further space saving of the power conversion circuit board 1.

Further, according to the power conversion circuit board 1 of the first embodiment, the high voltage circuit 10a has a series capacitor group 10a3 including a plurality of capacitor elements connected in series between the power supply wiring and the ground wiring.

In this way, since the voltage applied to one capacitor element is divided and reduced, it is possible to enhance the voltage resistance performance of the high voltage circuit 10a. Even if one of the capacitor elements is broken and short-circuited, it is possible to prevent the power supply wiring and the ground wiring from being short-circuited by the other capacitor elements connected in series.

Furthermore, in this way, since it is possible to select each capacitor element constituting the series capacitor group 10a3 as desired, the impedance characteristic of the series capacitor group 10a3 as a whole can be properly controlled in accordance with the electromagnetic noise specific to the product.

As described above, it is possible to reduce the influence of electromagnetic noise on an external device, and to further attain a high breakdown voltage.

Further, according to the power conversion circuit board 1 of the first embodiment, each capacitor element constituting the series capacitor group 10a3 has different impedance characteristics (frequency characteristics of impedance) which enable reduction of electromagnetic noise at the plurality of frequencies to correspond to the plurality of frequencies at which the electromagnetic noise is equal to or more than the specified value TH (FIG. 6A).

In this way, it is possible to effectively reduce the electromagnetic noise of a desired frequency by combining the frequency characteristics of different impedances to correspond to the frequencies with strong electromagnetic noise (frequencies f1 and f2 of FIG. 6A).

Further, according to the power conversion circuit board 1 according to the first embodiment, the series capacitor group 10a3 is mounted at the same position on the front surface side and the back surface side of the board main body portion 10.

Also, two sets of series capacitor groups 10a3 mounted at the same position on the front surface side and the back surface side of the board main body portion 10 are mounted so that the arrangement patterns of the plurality of capacitor elements are the same.

A floating capacitance corresponding to each positional relationship is assumed to be formed between the capacitor elements. Therefore, by making the arrangement pattern the same, it is possible to equalize the capacitance values of the series capacitor group 10a3 on the front surface side and the back surface side, including the floating capacitance according to the arrangement pattern.

Modified Example of First Embodiment

Although the power conversion circuit board 1 according to the first embodiment has been described in detail above, the specific aspects of the power conversion circuit board 1 are not limited to the above-described aspects, and various design changes and the like can be added within the scope that does not depart from the gist of the present invention.

For example, in the first embodiment, the power conversion circuit board 1 has been described as being disposed such that the wiring from the high voltage input terminal 10a1 to the switching element SW and the wiring from the switching element SW to the high voltage output terminal 20*b* intersect with each other. However, in other embodiments, the present invention is not limited thereto.

That is, in the power conversion circuit board 1 according to another embodiment, the wiring from the high voltage input terminal 10*a*1 to the switching element SW, and the wiring from the switching element SW to the high voltage output terminal 20*b* do not necessarily intersect with each other. For example, an aspect in which at least part of both of them extends while overlapping each other may be adopted.

Although the aspect in which the RC circuit 10*a*2 is connected to the power conversion circuit board 1 in the first embodiment for the purpose of reducing electromagnetic noise according to the driving of the switching element SW has been described, other embodiments are not limited thereto.

That is, the power conversion circuit board 1 according to another embodiment may be an aspect that does not include the RC circuit 10*a*2. In this case, the power conversion circuit board 1 according to another embodiment may be an aspect in which only the lands on which the RC circuit 10*a*2 can be mounted is formed.

By providing only the region for mounting the RC circuit 10*a*2 in this manner, it is possible to select whether to mount or not to mount the RC circuit 10*a*2 in accordance with a customer's request (degree of electromagnetic noise to be reduced).

While several embodiments of the invention have been described, these embodiments are presented by way of example and are not intended to limit the scope of the invention. These embodiments can be provided in various other forms, and various omissions, substitutions, and changes can be made within the scope that does not depart from the gist of the invention. These embodiments and modifications thereof are included in the scope or the gist of the invention, and are included within the invention described in the claims and the equivalent scope thereof.

INDUSTRIAL APPLICABILITY

According to the above-described power conversion circuit board and electric compressor, it is possible to reduce the influence of electromagnetic noise on the external device, and to further attain a high breakdown voltage.

REFERENCE SIGNS LIST

1 Power conversion circuit board
10 Board main body portion
10*a* High voltage circuit
10*a*1 High voltage input terminal
10*a*2 RC circuit
10*a*3 Series capacitor group
10*b* Low voltage circuit
11 Fixing hole
20 Bus bar support member
20*a* Bus bar connection terminal
20*b* High voltage output terminal
SW Switching element
C Capacitor
L Inductor

The invention claimed is:

1. A power conversion circuit board on which a power conversion circuit configured to convert direct current to alternating current is mounted,
   wherein a low voltage circuit to which a low voltage is applied and a high voltage circuit to which a high voltage is applied are separately disposed in different areas on the same board surface,
   the high voltage circuit has a series capacitor group including a plurality of capacitor elements electrically connected in series between a power supply wiring to which the high voltage in the high voltage circuit is applied and a ground wiring to reduce an electromagnetic noise, each of the plurality of capacitor elements having an elongated shape and none of adjacent capacitors elements extend in a same direction,
   the power supply wiring includes a high voltage input terminal and a switching element which are mounted on the high voltage circuit, wherein the power supply wiring is configured such that the high voltage input from the high voltage input terminal is input to the switching element,
   the series capacitor group is mounted at the same position on a front surface side and a back surface side of the board, and
   two sets of the series capacitor groups mounted at the same position on the front surface side and the back surface side are mounted in a wiring pattern in which all the plurality of capacitor elements are arranged at the same position corresponding to each other on the front surface side and the back surface side.

2. The power conversion circuit board according to claim 1, wherein each of the capacitor elements forming the series capacitor group has different impedance characteristics which enable reduction of electromagnetic noise at a plurality of frequencies in correspondence with the plurality of frequencies at which the electromagnetic noise is equal to or higher than a specified value.

3. An electric compressor comprising:
   the power conversion circuit board according to claim 1; and
   a motor which operates on the basis of AC power supplied from the power conversion circuit board.

4. An electric compressor comprising:
   the power conversion circuit board according to claim 2; and
   a motor which operates on the basis of AC power supplied from the power conversion circuit board.

5. The power conversion circuit board according to claim 1, wherein a first capacitance value of the series capacitor group mounted on the front surface side and a second capacitance value of the series capacitor group mounted on the back surface side are the same, the first capacitance value and the second capacitance value both including floating capacitances generated between the plurality of capacitor elements included in each of the series capacitor groups.

6. An electric compressor, comprising:
   the power conversion circuit board according to claim 5; and
   a motor which operates on the basis of AC power supplied from the power conversion circuit board.

* * * * *